US006780511B2

(12) United States Patent
Gerber

(10) Patent No.: US 6,780,511 B2
(45) Date of Patent: Aug. 24, 2004

(54) N-SUBSTITUTED ARYLAMINO-PHENOL-FORMALDEHYDE CONDENSATES

(75) Inventor: Arthur H. Gerber, Louisville, KY (US)

(73) Assignee: Borden Chemical, Inc., Columbus, OH (US)

( * ) Notice: Subject to any disclaimer, the term of this patent is extended or adjusted under 35 U.S.C. 154(b) by 85 days.

(21) Appl. No.: 10/235,326

(22) Filed: Sep. 5, 2002

(65) Prior Publication Data

US 2004/0048072 A1 Mar. 11, 2004

(51) Int. Cl.$^7$ .......................... B32B 27/38; B32B 27/04; C08L 61/34; C08L 63/00
(52) U.S. Cl. ................... 428/414; 428/297.7; 428/375; 428/396; 428/413; 525/509; 525/515; 525/516; 525/523
(58) Field of Search .............................. 428/297.7, 375, 428/396, 413, 414, 415, 416, 417, 418; 525/509, 515, 516, 523, 528

(56) References Cited

U.S. PATENT DOCUMENTS

| | | | |
|---|---|---|---|
| 3,751,471 A | 8/1973 | Becker | 260/570.5 P |
| 4,278,733 A | 7/1981 | Benzinger | 428/413 |
| 4,444,634 A | 4/1984 | Kempter et al. | 204/181 |
| 4,500,691 A * | 2/1985 | Stockinger et al. | 525/503 |
| 4,518,748 A | 5/1985 | Haug et al. | 525/481 |
| 4,525,542 A | 6/1985 | DeGooyer | 525/484 |
| 4,552,935 A | 11/1985 | Haug et al. | 525/488 |
| 4,568,727 A | 2/1986 | Herzog et al. | 525/481 |
| 4,933,392 A | 6/1990 | Andrews et al. | 525/110 |
| 4,985,530 A | 1/1991 | Murakami et al. | 528/103 |
| 5,075,411 A | 12/1991 | Ogawa et al. | 528/99 |
| 5,091,474 A | 2/1992 | Murakami et al. | 525/109 |
| 5,120,817 A | 6/1992 | Speranza et al. | 528/99 |
| 5,200,475 A | 4/1993 | Dewhirst | 525/486 |
| 5,268,434 A | 12/1993 | Hefner et al. | 525/529 |
| 5,569,536 A | 10/1996 | Hunter et al. | 428/413 |
| 5,688,876 A | 11/1997 | Ando et al. | 525/504 |
| 5,783,644 A | 7/1998 | Ando et al. | 525/504 |

FOREIGN PATENT DOCUMENTS

WO    WO 99/29756    6/1999

OTHER PUBLICATIONS

M. Miocque et al. Application of the Mannich reaction to aryl amines., I. Aminomethylation of dialkylanilines. *Bul. Soc. Chim. Fr.* 1970. (5). pp. 1896–1900. ( Item 130710z, vol. 73, 1970, *Chem. Abstracts*.) **.

M. Miocque et al. Application of the Mannich reaction to aryl amines. III. Amino–methylation of secondary and tertiary toluidines. *Bull. Soc. Chim. Fr.* 1970, (5), pp. 1907–1910. (Item 130711a, *Chem. Abstracts*, vol. 73, 1970)****.

M. Miocque et al. Application of the Mannich reaction to aryl amines. II. Amino–methylation of N–alkylanilines. *Bull Soc. Chim. Fr.* 1970, (5), pp 1901–1907. (Item 130712b. *Chem Abstracts* vol. 73. 1970.) **.

H. A. Bruson, et al. *J. Am. Chem. Soc.* 63, 270 (1941).

R. L. Hull, *J. Am. Chem. Soc.*, 77, 6376 (1955).

M. Julia, *Bull. Soc., Chim. France*, 1955 , 830***.

J. Burke et al. *Chem. Abstracts*, 45, 2487 (1951).

J. Burke et al. *Chem. Abstracts*, 47, 5408 (1953).

J. Burke et al. *Chem Abstracts*, 50, 6408 (I1956).

J.F. Walker "Formaldehyde" $3^{rd}$, Ed. p p 360–362, 370, 1964, Reinhold Publishing.

A. Gardziella, L.A. Pilato and A. Knop, "Phenolic Resins", pp 57–58, Springer–Verlag, N. Y.

* cited by examiner

*Primary Examiner*—Philip Tucker
*Assistant Examiner*—Michael J Feely
(74) *Attorney, Agent, or Firm*—Cantor Colburn LLP

(57) ABSTRACT

There is disclosed N-substituted arylamino-phenol-formaldehyde condensates which are substantially free of water, contain not more than 2% by weight of a phenol and possess unobvious properties, e.g., which have the residues of an N-substituted arylamine and 1.5 to 3 moles of formaldehyde for each mole of the said arylamine, contain from about 35% to 63% by weight of phenol residue, contain at least 3.5% by weight of nitrogen, have a melt viscosity of less than 2,000 cps at 175° C., a hydroxyl equivalent of about 195 to 220, a Methanol Tolerance of at least 40%, high solubility in organic solvents commonly used in epoxy formulations, and are self-catalyzing curatives for epoxy resins.

14 Claims, No Drawings

N-SUBSTITUTED ARYLAMINO-PHENOL-FORMALDEHYDE CONDENSATES

This invention relates to nitrogen containing N-substituted arylamino-phenol-formaldehyde condensates, e.g. those of N-ethylaniline-phenol-formaldehyde, which have a low melt viscosity, are soluble in solvents commonly used in epoxy formulations, and are self-catalyzing curatives for epoxy resins. This latter property permits faster curing and/or curing at lower temperatures while providing adequate mix life.

It has now been found that N-substituted arylamino-phenol-formaldehyde condensates having desirable and unexpected properties can be produced by:

(A) charging to a reaction vessel a phenol and (a) one member selected from the group consisting of formaldehyde and an N-substituted arylamine, e.g. N-ethylaniline, to form a reaction mixture; subsequently
(b) charging the remaining member of said group to the reaction mixture;
(B) heating the reaction mixture until all of the formaldehyde and said arylamine have reacted and the condensate contains from about 35% to 63% by weight of phenol residue wherein
(i) the molar ratio of said phenol to formaldehyde to said arylamine is 1.5 to 4 moles of the phenol and 1.5–3 moles of formaldehyde for each mole of the arylamine;
(ii) the phenol is a member selected from the group consisting of phenol itself, an alkylphenol having from 1 to 4 carbon atoms in the alkyl group, a meta- or ortho-alkoxyphenol having from 1 to 4 carbon atoms in the alkoxy group, and mixtures thereof; and
(iii) said arylamine is a member selected from the group consisting of a mononuclear (1) or dinuclear (11) compound as represented by the following Formula I and Formula II, respectively:

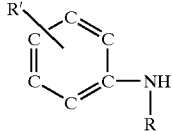

Formula I

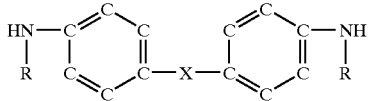

Formula II wherein R is alkyl of 1 to 4 carbon atoms, hydroxyethyl or hydroxypropyl; R' is hydrogen, methyl or ethyl in the ortho or meta position in relation to the nitrogen; and X is either a covalent bond, oxygen, sulfur, carbonyl or —$SO_2$—. In place of the formaldehyde being substantially all formaldehyde, the above method includes the substitution of up to about 20 mole percent of the formaldehyde with an equal molar quantity of another aldehyde having from 2 to 7 carbon atoms.

The condensates of this invention have a nitrogen content of about 3.5% to about 6.5% by weight. Thus, in addition to being effective self-catalyzing curing agents for epoxy resins, the condensates of this invention also provide enhanced fire-retardant properties to epoxy compositions. Furthermore, lower concentrations of the condensates can be employed as accelerators for curing epoxy resins with phenol-formaldehyde resins as compared to the use of conventional accelerators. Condensates of this invention also provide other beneficial properties that include, but are not limited to, improved adhesion to metals, particularly copper, improved impact resistance to cured epoxy formulations, and improved moisture resistance as compared to phenol-formaldehyde novolac curing agents. The condensates of this invention are also suitable in the manufacture of molded products as well for other uses enjoyed by phenolic novolac resins.

BACKGROUND AND PRIOR ART

The reaction of phenolic compounds with amines, generally secondary amines, and formaldehyde is well known and are an example of the Mannich condensation, e.g., see H. A. Bruson, C. W. McMullen, J. Am. Chem. Soc., 63, 270 (1941); M. Julia, Bull. Soc., Chim. France, 1955, 830; and R. L. Hull, J. Am. Chem. Soc., 77, 6376 (1955). However, the products of the reactions cited in the above references are oligomers as contrasted to polymers having more than 4 repeating units and may act as accelerators for epoxy reactions but not as effective curing agents. The reason for this is that the hydroxyl functionality of such materials is only about one or two which provides insufficient crosslinking as compared to conventional curing agents such as phenol-formaldehyde curing agents which have a hydroxyl functionality of at least 6. Likewise the products of substituted phenols with N-monoalkylanilines and formaldehyde (M. Miocque, J. M. Vierfond, Bull. Soc. Chem. France, 1970, 1901, or with N,N-dialkylanilines and formaldehyde (ibid, p. 1896) give monoaminomethylated products unsuitable as effective epoxy curing agents whereas the condensates of this invention produce polymers having more repeating units and viscosities of at least 700 cps at 150° C.

U.S. Pat. No. 4,518 748 of May 21, 1985 to Haug et al. as well as U.S. Pat. No. 4,552,935 of Nov. 12, 1985 to Haug et al., show curable epoxide compositions containing condensates prepared from certain phenols, certain amines and aldehydes in an acid medium. However, only primary and tertiary amines are shown.

U.S. Pat. No. 5,569,536 of Oct. 19, 1996 to J. Hunter et al. use polyamines with primary amino end groups and further, the mole ratio of ingredients are substantially different from those of the instant invention. Furthermore, the condensates of this 536 patent cannot form significant amounts of acyclic tertiary amino linkages.

N,N'-dialkylalkylene diamines can form condensates with phenol and an aldehyde. However, the alkylene group unlike the arylene group is more susceptible to thermal and flame degradation. Moreover, such condensates would be more highly basic than the condensates of the instant invention and would provide poor mix stability in formulations with epoxy resins. Basic ionization constants (pK) for highly basic amines such as N,N-dimethylbenzylamine, and N,N-dimethyl hexylamine are 9.02, and ca. 10, respectively.

Primary aliphatic or aromatic amines, unlike the N-substituted arylene amines of the instant invention, react with aldehydes to form unstable N,N-dimethylol compounds or alkyleneimines which generally are unstable and can trimerize or even polymerize (J. F. Walker, "Formaldehyde", $3^{rd}$ ed. pp. 360–362, 370, 1964, Reinhold Publishing Corp.). Tertiary amino N,N-dialkylarylamines cannot form the tertiary amino N—$CH_2$-groups as part of a condensate. Tertiary amino groups of the instant condensates, particularly as the idealized repeating units of (N—$CH_2$-Aryl-$CH_2$-Aryl-)$_n$, are believed to be responsible for enhancing the flexibility/toughness of cured epoxy resins.

In Chem. Abst., 45, 2487i (1951), W. J. Burke et al., several primary amines were reacted with formaldehyde and polyhydroxy benzenes (i.e., hydroxyphenols) to give substituted benzo bis-and tris-m-oxazines.

In Chem. Abst., 47, 5408i (1953), W. J. Burke et al., 2-Naphthol was condensed with formaldehyde and aliphatic or alicyclic primary amines to give substituted naphtho m-oxazines or substituted methylene diamines, depending on reaction conditions. None of the above Burke et al. products were polymeric and none were derived from aromatic amines.

In Chem. Abst., 50, 6408i (1956) W. J. Burke et al., aromatic primary amine, 2-naphthylamine, was reacted with formaldehyde and 2-naphthol. Products of this reaction were non-polymeric being a substituted naphthol m-oxazine and a naphthylaminomethylated 2-naphthol. None of the above W. J. Burke et al. references use an N-substituted amine.

Primary aromatic amines can also be reacted with phenol and aldehydes such as formaldehyde to give benzoxazines. In the case of a diphenolic compound a primary amine and formaldehyde difunctional benzoxazines and other oligomers are formed (A. Gardziella, L. A. Pilato, A. Knop, "Phenolic Resins", pp. 57–58, 1999, Springer-Verlag, N.Y.). Benzoxazines, unlike the condensates of the instant invention undergo facile ring opening with active hydrogen compounds including phenol and phenolic oligomers.

SUMMARY OF THE INVENTION

In one aspect, this invention is directed to N-substituted arylamino-phenol-formaldehyde condensates which are substantially free of water, contain not more than 2% by weight of a phenol and possess unobvious properties, e.g., which have the residues of an N-substituted arylamine and 1.5 to 3 moles of formaldehyde for each mole of the said arylamine, contain from about 35% to 63% by weight of phenol residue, contain at least 3.5% by weight of nitrogen, have a melt viscosity of less than 2,000 cps at 175° C., a hydroxyl equivalent of about 195 to 220, a Methanol Tolerance of at least 40%, high solubility in organic solvents commonly used in epoxy formulations, and are self-catalyzing curatives for epoxy resins.

In another aspect, this invention is directed to an epoxy resin composition containing an N-substituted arylamino-phenol-formaldehyde condensate of this invention.

In another aspect, this invention is directed to prepregs containing compositions of an epoxy resin and an N-substituted arylamino-phenol-formaldehyde condensate of this invention.

In another aspect, this invention is directed to cured compositions comprising the N-substituted arylamino-phenol-formaldehyde condensates of this invention with epoxy resins as well as laminates containing the condensates and epoxy resins.

In yet another aspect of this invention the N-substituted arylamine-phenol-formaldehyde condensates of this invention either alone or in admixture with another epoxy curing agent and/or another fire-retardant can be used as fire-retardant curing agents for epoxy resins.

In another aspect, this invention is directed to methods for the manufacture of the N-substituted arylamino-phenol-formaldehyde condensates as well as epoxy compositions, prepregs and laminates containing the same.

In another aspect, this invention is directed to the condensates, epoxy compositions, prepregs and laminates prepared by the above described methods.

DETAILED DESCRIPTION OF THE INVENTION

The Phenol Monomer

The phenol monomer, also, simply referred to as a phenol or simply phenol, can be: phenol itself; an alkyl phenol having from 1 to 4 carbon atoms in the alkyl grup, preferably a meta or ortho alkyl phenol having from 1 to 4 carbon atoms in the alkyl group, and mixtures thereof. Illustrative of a phenol there can be mentioned: phenol itself; meta-cresol; ortho-cresol; para-cresol; 4-ethyl phenol; 4-methyl phenol; 2-ethyl phenol; 3-ethyl phenol; 3-isopropyl phenol; 3-methoxy phenol; 3-ethoxy phenol; 3-isobutyl phenol; etc. Phenol itself is the preferred phenol monomer. The quantity of a phenol charged to the reactor in the manufacture of the condensates of this invention is from about 1.5 to 4 moles of a phenol for each mole of N-substituted arylamine. Preferably, 2 to 4 moles of a phenol are charged for each mole of the N-substituted arylamine. Also preferred is a mixture of at least 90% by weight of phenol itself and not more than 10% by weight of the alkyl phenol, alkoxy phenol and mixtures of the alkyl phenol and alkoxy phenol, particularly when the phenol is an ortho- or meta-substituted alkyl phenol. The quantity of phenol charged to the reactor is much greater than the amount which reacts in the formation of the condensates so that free, unreacted, phenol is typically distilled out of the reaction mixture after completion of the reaction.

The N-substituted Arylamine Monomer

The N-substituted arylamine monomer can be either mono nuclear or di-nuclear as represented by Formula I and Formula II below as well as mixtures thereof wherein one or more Formula I compounds make up at least 80% and preferably at least 90% by weight of the N-substituted arylamine:

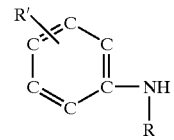

Formula I

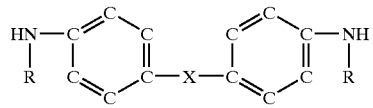

Formula II wherein each R is alkyl containing 1–4 carbon atoms, hydroxyethyl, and hydroxypropyl; R' is hydrogen, methyl or ethyl in ortho or meta position to the nitrogen; and X is selected from a covalent bond, O, S, carbonyl, and —SO$_2$—. As representative examples of Formula I compounds, there can be mentioned N-methylaniline, N-ethylaniline, N-ethyl-2-methylaniline, N-methyl-2-methylaniline, N-methyl-3-ethylaniline, and N-hydroxyethylaniline. As representative examples of Formula II compounds, there can be mentioned N,N'-dimethylbenzidine, bis (4-N-ethylphenylamino) sulfide; bis (4-N-methylphenylamino) oxide; bis (4-N-methylphenylamino) sulfone; and bis (4, 4'-N-ethylamino) benzophenone. Compounds of Formula I are preferred and N-ethylaniline and N-methylaniline are particularly preferred.

The quantity of the N-substituted arylamine charged to the reactor is about one mole for the total of 1.5 to 4 moles of the phenol and 1.5 to 3 moles of the formaldehyde.

The Formaldehyde Monomer

The formaldehyde monomer is preferably formaldehyde. However, up to about 20 mole % and preferably up to about 10 mole % of the formaldehyde can be replaced with other aldehydes such as those having from 2 to 7 carbon atoms. Illustrative of other aldehydes there can be mentioned: acetaldehyde, i-butyraldehyde, benzaldehyde; and mixtures thereof. The assay of 50% formalin used in the examples herein varied from 50.0% to 50.3%. Weights charged were such to provide the indicated moles. The term "formaldehyde" or "aldehyde" herein includes not only formaldehyde itself or other designated aldehydes, but also compounds yielding an aldehyde, e.g., paraformaldehyde, trioxymethylene, paraformaldehyde and the like. The aldehyde may be introduced neat or as a 20% to 50% solution in phenol to facilitate metering in the reaction mixture. However, the formaldehyde is generally charged to the reaction mixture as 50% formalin. Formalin generally contains small quantities of formic acid with about 0.03% of formic acid being typical in a 50% formalin solution.

The quantity of formaldehyde used in manufacture of the condensates of this invention varies from about 1.5 to 3 moles for each mole of the N-substituted arylamine, preferably, 1.8 to 2.2 moles per mole of N-substituted arylamine.

The Acid

Acids, preferably organic acids, when used in the methods of manufacture of the condensates of this invention have pK acidities of about one to about five. They are used at about 0.5% to about 3% based on phenol weight. Examples of such acids include oxalic acid, phenyl phosphonic acid, phosphoric acid, acetic acid, formic acid and lactic acid. The use of added acid in the methods of this invention produce condensates having higher viscosities and higher molecular weights as compared to the same method without the use of added acid. The condensates with the lower viscosities and lower molecular weights are preferred over those with higher viscosities and higher molecular weights.

Control of pH with Tertiary Amine

Strong organic tertiary aliphatic amines can be optionally employed in the manufacturing Methods (2) and (3) described hereafter. The tertiary amine is preferably added after the N-substituted arylamine has substantially reacted. The intent of adding the amine is to facilitate reaction of phenol with the aldehyde. pK basicities for the amines used for such pH control are about 9.5 to about 11.3, preferably at least 10. They are used at about 0.5% to about 2% by weight of phenol. Examples of such amines are represented by triethylamine, tributylamine, diethylisopropylamine, N-methyl- and N-ethyl piperidine, N,N-dimethylcyclohexylamine, and di-n-butylaminoethanol.

The Solvent

Solvents for the condensates can be optionally employed in all methods for the manufacture of the condensates of this invention and can be added before or after addition of formaldehyde [Methods (1) and (2) described hereafter] or N-substituted arylamine [Methods (3) and (4) described hereafter]. Solvent classes include aliphatic alcohols, monoalkyl ethers of alkylene glycols and di-alkyl ethers of alkylene glycols. These solvents can advantageously be employed to replace a significant portion of excess phenol. The solvent and excess unreacted phenol can subsequently be recovered by atmospheric or vacuum distillation at elevated temperatures. Representative solvents include n-butanol, isobutanol, alkoxy (1 to 4 carbon atoms) ethanols, mono-alkoxy (1 to 4 carbons atoms) ethers of diethylene glycol, di-methyl and di-ethyl ethers of diethylene glycol. High boiling point (i.e., at least about 160° C.) solvents (e.g., monomethylether ether of diethylene glycol) can be recovered simultaneously with phenol and re-used in a subsequent reaction. The preferred solvents are those which have a boiling point close to that of phenol.

The N-Substituted Arylamino-Phenol-Formaldehyde Condensates

The condensates of this invention will contain from about 3.5% to 6.5% nitrogen, preferably about 5% to 6% nitrogen based on the weight of the condensate; have a melt viscosity of from about 700 cps (centipoise) at 150° C. to not more than about 2,000 cps at 175° C. and preferably not more than 1,000 cps at 175° C.; be substantially free of water; and contain not more than about 2% by weight of free (unreacted) phenol. Preferred condensates will have a Methanol Tolerance of at least about 40% as measured by the Methanol Tolerance method at 25° C., e.g. about 40% to 800%.

The quantity of phenol residue in the condensates of this invention is from about 35% to 63%, preferably 40% to 60% and particularly about 43% to 55% by weight of the condensate. The term "residue" or "residues" of a reactant, e.g., phenol, refers to the quantity of reactant consumed in the preparation of the condensates of this invention. Illustratively, if 10 grams (g) of a phenol is consumed in the reaction with an N-substituted arylamine and formaldehyde, the phenol residue of the composition would be 10 grams. Also, if 20 grams of a phenol is glycidylated and the glycidylated product is subsequently reacted with a phenol-formaldehyde novolac, the glyoxal-phenolic residue would still be 20 grams.

The condensates of this invention have hydroxyl equivalents of about 195 to about 220 as calculated from product yield (grams) by determining phenol content after subtracting the contribution of N-substituted arylamine and methylene (fragment resulting from formaldehyde). They are soluble in a variety of organic solvents including, but not limited to, n-butyl alcohol, methyl ethyl ketone (MEK), methyl isobutyl ketone, 2-ethoxyethanol, 1-methoxy-2-propanol, monomethylether of diethylene glycol, (methyl carbitol), bis(2-methoxyethyl)ether (diglyme), and N,N-dimethylacetamide. A variety of solvents and solvent mixtures are thus available to the laminating industry.

Condensates of the instant invention shows superior fire-retardance compared to phenol-formaldehyde novolacs as epoxy curing agents. Further enhancement of fire-retardency will occur when used in conjunction with high nitrogen (16%–20%) triazine-phenol-formaldehyde condensates and also when using phosphorus containing material, e.g. triphenlphosphine (at a concentration of about 1% in the epoxy resin) as accelerator, particularly with another phosphorus containing material, e.g., phosphorus acid.

Procedures for the Manufacture of the Condensates of this Invention

Broadly the condensates of this invention are made by (A) charging to a reaction vessel a phenol and (a) one member selected from the group consisting of formaldehyde and N-substituted arylamine to form a reaction mixture, preferably the reaction mixture is at a temperature of not less than about 40° C., and particularly about 50° C. to 80° C., (b) charging the remaining member of said group to the reaction mixture;

(B) heating the reaction mixture, until all of the formaldehyde and said arylamine have reacted, preferably at a temperature of about 70° C. to 110° C., and the condensate contains from about 35% to about 63% by weight of phenol residue and wherein (I) 1.5 to 4 moles of a phenol and 1.5 to 3 moles of formaldehyde are charged to the reactor for each mole of the N-substituted arylamine, (ii) the phenol is a member selected from the group consisting of phenol itself, an alkylphenol having from 1 to 4 carbon atoms in the alkyl group, a meta- or ortho-alkoxyphenol having from 1 to 4 carbon atoms in the alkoxy group, and mixtures thereof; and said N-substituted arylamine is a member selected from the group consisting of a compound of the following Formula I and Formula II as well as mixtures thereof wherein one or more of the Formula I compounds make up at least 80%, and preferably 90%, by weight of the N-substituted arylamine:

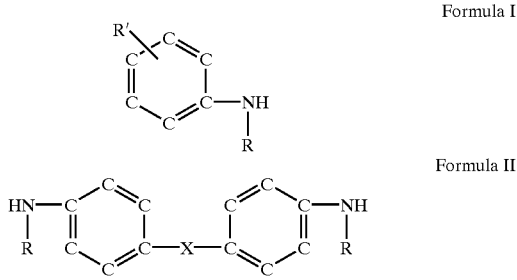

wherein R is alkyl containing 1–4 carbon atoms, hydroxyethyl, or hydroxypropyl; R' is a member selected from the group consisting of hydrogen, methyl or ethyl in the ortho or meta position in relation to the nitrogen; and X is a member selected from the group consisting of a covalent bond, oxygen, sulfur, carbonyl, or $SO_2$. Mixtures of the various N-substituted arylamine compounds can also be used. The formaldehyde and the said arylamine react readily but it may be necessary to continue the heating, preferably at an elevated temperature such as up to about 110° C. until the reaction of the phenol is substantially complete.

Within the above generic method for the manufacture of the condensates of this invention, there are a number of preferred submethods which are set forth below. Such submethods produce condensates of this invention which can and often do have some different properties from condensates produced by one of the other methods, e.g., condensates produced under pH conditions of at least 6.5 and particularly 7.0 or more have some properties which differ from condensates prepared under conditions of a pH of about 6 or less.

The pH of the reaction mixture for the phenol, N-substituted arylamine and formaldehyde or formaldehyde with another aldehyde is generally above 6, preferably above 6.5 and particularly above 7 such as 7.5 or more.

1. The Standard Method Using an Acid (Method 1)

In this method a phenol and an N-substituted arylamine, e.g., N-ethylaniline, are charged to the reactor to form a mixture. The mixture is heated at a temperature of about 30° C. to 100° C. and preferably from about 50° C. to about 80° C. and formaldehyde is added. Acid is added to the reaction mixture, preferably an organic acid. The acid can be added before or after introduction of the formaldehyde. Although the reaction of the N-substituted arylamine and formaldehyde is essentially instantaneous further heating, e.g. 70° C. to 110° C. is necessary to have the requisite equivalent of phenol reacted. Typically, after addition of formaldehyde the reaction mixture is heated several hours at 70° to about 100° C. until the reaction of the phenol is substantially complete. Typical pHs of reaction mixture before and after addition of acid are about 7.0 to 7.5 and about 5–6.5, respectively.

2. The Standard Method Without Acid (Method 2)

This method is essentially identical to the Standard Method described above except that no acid is used.

3. The Reverse Method Without Acid (Method 3)

This method uses essentially the same quantities as in Method (2) above but with two major distinctions. Phenol and formaldehyde, not phenol and N-substituted arylamine, are charged to the reactor. The N-substituted arylamine is then added to the reaction mixture. The temperature at which the said arylamine is added is preferably less than about 85° C. and particularly about 50° C. to about 80° C. The reactants can be added sequentially which can serve the purpose of improving temperature control. For example, ½ of the formaldehyde can be charged with the phenol and ½ of the N-substitutedarylamine added shortly thereafter. The remainder of formaldehyde is added followed by the remainder of N-substituted arylamine. The second addition of N-substitutedarylamine may be at the same temperature previously used or may be higher possibly by 10° C. In instances when more than one N-substitutedarylamine is used, they can be added together or separately. Additions of formaldehyde should be made quickly, whereas, additions of N-substitutedarylamine should be made gradually. Typically after addition of N-substitutedarylamine the reaction mixture is heated several hours at about 70° C. to about 110° C.

4. The Reverse Method with Acid (Method 4)

This method is essentially identical to the Method (3) above except that the acid is added after reaction of the N-substitutedarylamine is substantially complete.

5. A fifth method (Method 5)

This is similar to the Second Method cited above except that an organic amine with pK basicity of about 9.5 to 11.3 at about 0.5% to about 2% by weight on phenol is added prior to addition of the formaldehyde. Typical pH's of reaction mixtures are about 7.5 to about 9. Organic amines are preferred to inorganic alkaline materials so as not to introduce metal ions which would be deleterious in many electronic applications. The Method 5 can continue as in the second method or, optionally, after the N-substituted arylamine is added, an acid is added. The type of acid and its quantity is the same as set forth hereinbefore under the discussion on the acids to be used.

6. A sixth method (Method 6) This method sequentially combines Methods (2) and (3) above, preferably with all the phenol present at the onset, for example Method (2) is performed until the phenol is substantially reacted. The temperature is adjusted to less than about 80° C. and Method (3) is performed. This is illustrated in Example 35 herein.

In the manufacture of the condensates of this invention, substantially all of the aldehyde and N-substituted arylamine is reacted whereas phenol is used in excess and is distilled out of the reaction mixture after completion of the reaction.

Removal of Water and Free Phenol

After the substantial complete reaction of the phenol, water can be removed from the reaction mixture by distillation. Alternatively, the reaction can be stopped when the condensate, i.e., after removal of free phenol and water, contains the requisite quantity of phenol residue, e.g., from 35% to 63% by weight of the condensate. Whatever water is not removed during any initial distillation is removed when the excess phenol ,i.e., free (unreacted) phenol, is removed from the reaction mixture by conventional techniques such as that used for removal of phenol from other novolac resins such as by raising the temperature to about 190° C. together with increasing the vacuum to about 29 inches of mercury. Steam sparging with or without vacuum at such temperatures can also be used to remove phenol in the product, particularly to achieve free phenol levels of not more than 2% and particularly levels of less than 0.5% in the condensate. Steam sparging was applied after vacuum distillation recovery of phenol in all examples except Ex.'s 1–7, 9, 10, 13, 14, 16, 18 and 24.

The Epoxy Compositions

The epoxy resins used in making the flame retardant compositions and laminates of this invention will typically have WPE (weight per epoxy) values of about 190 to about 10,000 and preferably about 190 to about 500. Illustrative of the epoxy resins, there can be mentioned those of diglycidyl ether resins, such as those having the above mentioned WPE values, prepared by contacting a dihydroxy compound with an excess of epichlorohydrin in the presence of an alkali metal hydroxide wherein the dihydroxy compound can be: bisphenol A; brominated bisphenol A; bisphenol F; resorcinol; neopentyl glycol; cyclohexanedimethanol, and the like; and mixtures thereof. Such resins are also referred to as being based on or derived from the dihydroxy compound involved, e.g. bisphenol A. Also, such conventional epoxy resin can be that of: epoxy phenol novolacs; epoxy cresol novolacs, particularly glycidyl ethers of an o-cresol/formaldehyde novolacs; aromatic glycidyl amine resins such as triglycidyl-p-amino phenol; N, N, N', N'-tetraglycidyl-4, 4'-diaminodiphenyl methane; and glycidyl ethers of a phenolic novolac.

Epoxy curing accelerators are used in the epoxy compositions in a quantity sufficient to accelerate the cure of the epoxy resin. Generally, such quantity is from about 0.05 to 0.5 parts based on 100 parts of the base epoxy resin and particularly about 0.1 to 0.2 parts. Such accelerators include 2-methylimidazole, 2-ethyl-4-methylimidazole, amines such as 2,4,6-tris(dimethylaminomethyl)phenol and benzyldimethylamine, and organophosphorus compounds such as tributylphosphine and triphenylphosphine.

Laminates of the Epoxy Resin Compositions

The laminate structures of this invention are conventional laminates. Such laminates, in this case will contain a reinforcing agent such as glass cloth, and a cured resinous matrix comprising an epoxy resin and an N-substituted arylamino-phenol-formaldehyde condensates of this invention as curing agent and flame-retardant alone or together with other curing agents and/or flame retardant agents for the epoxy resin. The laminates of this invention will comprise the reinforcing agent together with the cured epoxy compositions mentioned hereinabove.

The structure of the laminates of this invention are the same as those of conventional laminates containing a reinforcing agent such as glass cloth, and a resinous matrix comprising an epoxy resin and a curing agent for the epoxy resin.

The laminates of this invention will generally contain about 40% to 80% by weight of resinous matrix material and about 20% to 60% by weight of reinforcing material such as glass cloth.

Conventional laminating techniques can be used in making the laminates of this invention such as the wet or dry-lay-up techniques. Multiple layers of resin impregnated reinforcing material, upon curing, make up the laminate.

The pressure used in making the laminates can vary from the contact pressure of applying a laminated lining to a tank wall to the high pressure, e.g., 1,000 psi or more, used in the manufacture of electrical insulation sheets. The temperature used in making the laminates can vary over a wide range such as that of about room temperature to over 210° C. The use of a solvent in the laminate compositions is optional. Conventional laminating techniques can be used in making the laminates of this invention, e.g., such as the wet or dry-lay-up techniques.

Reinforcing fibers or fabrics of reinforcing fibers for use in laminates include glass fibers and mats, carbon and graphite fibers, cellulosic paper, fibrous polyamide sheets, fibrous quartz sheets, woven fibrous glass cloth, unwoven fibrous glass mat, and the like. The epoxy resin composition will be impregnated in the reinforcing fibers or fabrics or the interstices formed from of such fibers or fabrics. Fillers such as quartz powdered, mica, talc, calcium carbonate and the like may also be added to the resinous matrix in the manufacture of the laminate.

Compositions of this invention when used in electronic applications such as laminates for the production of printed circuit boards will typically comprise the following composition based on 100 parts of an epoxy resin:

(a) about 0–30 parts of phenolic-formaldehyde novolac;
(b) about 5–100 parts of the N-substituted arylamino-phenol-formaldehyde condensates of this invention and preferably, when (b) is 5 to 25 parts, then (a) is about 20–30 parts.; and optionally, an epoxy curing accelerator. Generally, in determining the quantity of curing agent, e.g., phenolic-formaldehyde novolac and the condensates of this invention, the hydroxyl equivalence should be about 0.8 to 1.1 parts of hydroxyl equivalent for each epoxy equivalent.

The N-substituted arylamino-phenol-formaldehyde condensates of this invention can be used alone as both the curing agent and to impart flame-retardant properties to the epoxy resin. Alternatively, the N-substituted arylamino-phenol-formaldehyde condensates can be used together with one or more conventional epoxy resin curing agents and/or flame-retardant agents.

A variety of additional curing agents well known in the art can be used together with the N-substituted arylamino-phenol-formaldehyde condensates of this invention in curing the epoxy resin. They include but are not limited to aromatic amines, polyamidoamines; polyamides; dicyandiamide; phenolic-formaldehyde novolacs; melamine-formaldehyde resins; melamine-phenolic-formaldehyde resins; and benzoguanamine-phenolic-formaldehyde resins.

Reactive diluents may also be present in the epoxy compositions to lower viscosity and improve handling characteristics. Examples of reactive diluents include neopentylglycol diglycidyl ether; butanediol diglycidyl ether; resorcinol diglycidyl ether; and cyclohexane dimethanol diglycidyl ether.

In order that those skilled in the art may more fully understand the invention presented herein, the following procedures and examples are set forth. Unless otherwise indicated, the following units of measurement and definitions apply in this application unless otherwise indicated: all parts and percentages are by weight; temperatures are in degrees centigrade (° C.); use of oxalic acid is as the dihydrate; and readings of vacuum are in inches of mercury. The designator "Ex" in the Tables is the abbreviation for examples.

EXAMPLES 1 AND 2

Preparation of N-Ethylaniline-Phenol-Formaldehyde Condensates

These examples were conducted in a manner similar to Example 3 described below except to the extent shown in Table 1A herein.

EXAMPLE 3

Preparation of N-Ethylaniline-Phenol-Formaldehyde Condensates

A one liter flask was charged with 301.2 g phenol (3.2 moles) and 194 g. N-ethylaniline (1.6 moles). The reaction mixture was heated to 70° C. and then 192 g 50% formalin (3.2 moles) was added over 45 minutes at 70–72° C. After 1½ hours at 71–73° C., 4 g acetic acid was added. The temperature was raised to 80° C. and maintained at 80° C. for 2 hours. The temperature was raised to 100° C. and maintained for 1½ hour. Reaction mixture was then atmospherically distilled to 160° C. to collect 156 g distillate. Phenol (92.1 g) was then recovered by vacuum distillation increasing temperature to 190° C. while increasing vacuum to 30 inches of mercury. Product yield was 432.7 g and is characterized in Table 1B.

EXAMPLES 4 THROUGH 15

These examples were run by the Standard Method in the same manner as Example 3, except to the extent shown in Table 1A herein.

EXAMPLE 16

Preparation of N-ethylaniline-
o-Cresol-Formaldehyde Condensates

This example was performed in the same way as Example 7 except that 3.2 moles o-cresol was substituted for the phenol. After heating at 100° C., an atmospheric distillate was taken and showed no free formaldehyde. Analysis of the product showed 0.05% o-cresol; 4.79% of nitrogen, Mw/Mn of 670/421; and viscosity at 150° C. of 297 cps.

It can be seen from the above Example 16 that substitution of phenol by o-cresol (Ex. 7) leads to a dramatic decrease in Mw and viscosity with the expected small decrease in percent nitrogen.

EXAMPLE 17

This example was run in the manner of Example 3 except to the extent shown in Table 2A herein.

EXAMPLES 18 AND 20

These examples were run by the Standard Method in the same manner as Example 3, except to the extent shown in Table 2A herein.

EXAMPLE 19

Preparation of N-Methylaniline-Phenol-
Formaldehyde Condensates

A one liter flask was charged with 376.4 g phenol (4.0 moles), 171.5 g N-methylaniline (1.6 moles) and 7.0 g 90% formic acid. The reaction mixture was heated to 70° C. and then 191 g 50% formalin (3.2 moles) was added at 70° C. over 1 hour. The temperature was maintained at 70° C. for 2 hours at which time the percent free phenol was determined to be 34.8% (vs. 50.5% for no reaction of phenol). The temperature was raised to 100° C. and maintained at 100° C. for one hour at which time the percent free phenol was 33.6%. Reaction mixture was then atmospherically distilled to 160° C. to collect 163 g distillate. Phenol (170 g) was then recovered by vacuum distillation increasing temperature to 190° C. while increasing vacuum to 30 inches of mercury. Product yield was 397 g and is characterized in Table 2B and Table 5.

EXAMPLES 21 AND 22

Examples 21, 22, and 24 were run by the Reverse Method such as Example 23, except to the extent shown in Table 3A.

EXAMPLE 23

Preparation of N-Methylaniline-Phenol-
Formaldehyde Condensates Via the Reverse
Method A one liter flask was charged with 244.7 g phenol (2.6 moles) and 86.1 g 50% formalin (1.44 moles). The reaction mixture was heated to 60° C. and then 85.8 g N-methylaniline (0.8 mole) and added over 30 minutes at 60° C. The temperature was lowered to 50° C. and 86.1 g 50% formalin (1.44 moles) quickly added. The temperature was raised to 55° C. and than 85.7 g N-methylaniline (0.8 mol) added over 32 minutes at 55–60° C. After 20 minutes at 60° C. the temperature raised to 100° C. and maintained at 100° C. for one hour. Reaction mixture was then atmospherically distilled to 160° C. to collect 136.8 g distillate. Phenol (56.3 g) was then recovered by vacuum distillation increasing temperature to 190° C. while increasing vacuum to 30 inches of mercury. Vacuum was broken and 100 ml deionized water added over 40 minutes at about 190° C. Vacuum was then applied to remove water at 190° C. under 30 inches of mercury. Product yield was 372 g and is characterized in Table 3B and Table 5.

EXAMPLE 24

This example was run in the same manner as Example 23 except to the extent shown in Table 3A herein.

EXAMPLE 25

Preparation of N-Ethylaniline-Phenol-Formaldehyde
Condensates Via the Reverse Method A one liter flask was charged with 376.4 g phenol (4.0 moles) and 95.4 g 50.3% formalin (1.6 moles). The reaction mixture was heated to 50° C. and then 96.8 g N-ethylaniline (0.8 mole) added over 35 minutes at 50–52° C. After 30 minutes at 50° C. the percent free phenol was 41.4% (vs. 66.2% if no phenol reacted). 95.4 g 50.3% formalin (0.6 mole) was then added. Then 96.8 g N-ethylaniline (0.8 mole) was added over ½ hour at 50° C. This temperature was maintained for 73 minutes, whereupon 7.0 g 90% formic acid was added. After 15 minutes the temperature was raised to 100° C. and maintained at 100° C. for 1 hour. Atmospheric distillate (163 g) phenol (149 g) and product (443. g) were recovered as described in Example 23 above. Product is characterized in Table 3B and Table 5.

EXAMPLE 26

Preparation of N-Ethylaniline-N-Methylaniline-
Phenol-Formaldehyde Condensates

A one liter flask was charged with 376.4 g of phenol (4.0 moles), 96.8 g N-ethylaniline (0.8 mole), 85.6 g N-methylaniline (0.8 mole) and 7.0 g. 90% formic acid. The reaction mixture was heated to 70° C. and then 191.0 g. of 50% formalin (3.2 moles) was added over 60 minutes at 70–72° C. After 2 hours at 70° C. the percent free phenol determined gas chromatographically was 31.5% (vs. 57.3% for no reaction of phenol). The temperature was raised to 100° C. and maintained at 100° C. for one hour at which time the percent phenol was determined to be 30.6%. Reaction mixture was then atmospherically distilled to 160° C. to collect 165 g. distillate. Phenol (165 g.) was then recovered by vacuum distillation increasing temperature to 190° C. while increasing vacuum to 30" inches of mercury. When phenol appeared to stop distilling over, vacuum was broken and 67 ml. of deionized water added over 50 minutes at about 190° C. Vacuum was then applied to remove water at 190° C. under 30 inches of mercury vacuum. Product yield was 406.3 g and was characterized by phenol, 0.65%; nitrogen, 5.53%; Mw/Mn, 1190/327; viscosity, 426 cps (175° C.) and in Table 5.

EXAMPLE 27

Preparation of N-Ethyaniline-N-Methylaniline-
Phenol-Formaldehyde Condensates

This example was conducted in a similar manner as Example 26 above except that phenol and formalin was added in 2 stages: 169.4 g phenol (1.80 moles) was charged initially and 96.5 g 50% formalin (1.60 moles) added to the reaction mixture over 25 minutes. After 85 minutes at 70° C. 132 g phenol (1.4 moles) was added followed by 1.6 moles 50% formalin at 70–75° C. over 30 minutes, Product was characterized by phenol, 0.44%; nitrogen, 6.08%; Mw/Mn, 1673/613; viscosity, 852 cps (175° C.).

This example shows that addition of phenol and formalin in two stages vs. one stage (Ex. 26) leads to higher Mw and viscosity.

EXAMPLE 28

Preparation of N-Methylaniline-Phenol-Formaldehyde Condensates Using Paraformaldehyde and 50% Formalin A 500 ml flask was charged with 150.6 g phenol (1.6 moles) and 85.8 g N-methylaniline(0.8 mole). To the reaction mixture at 33° C. was added 13.2 g. paraformaldehyde (0.4 moles). The reaction mixture was maintained at 31–40° C. for 56 minutes and another 13.2 g paraformaldehyde added (total now 0.8 moles). The reaction mixture was maintained at 42–58° C. during the course of 8 hours. Reaction mixture was essentially homogeneous. The percent unreacted phenol at this time was 57.0% (vs. 57.3% if no phenol reacted) and the percent water was 6.9%. Then 24 g 50% formalin (0.4 moles) was added over 23 minutes at 56–62° C. After 3½ hours at 57–64° C. 279 g (~3% loss) reaction mixture was transferred to another flask. Then at 55° C. 23.2 g 50% formalin (0.14 moles) was added over 14 minutes at 55–60° C. The reaction was heated 2 hours at 60° C. and 2 hours at 100° C. Atmospheric distillate (51.2 g), recovered phenol (35.8 g) and product (208.2 g) were isolated as described in Example 3 above. Product was characterized by Mw/Mn, 1642/516; viscosity of 630 cps at 180° C. and 6290 cps at 154° C.

EXAMPLE 29

Preparation of N-Ethylaniline-N,N'-Dimethyl Benzidine-Phenol-Formaldehyde Condensates This example may be conducted in a similar manner as Example 3 above except that 0.32 moles of N-ethylaniline can be replaced by 0.32 mole N,N'-dimethylbenzidine.

EXAMPLE 30

Preparation of N-Methylaniline-Phenol-m-Cresol-Formaldehyde Condensate

This example may be conducted in a similar manner as Example 23 above except that 0.6 moles of phenol can be replaced by 0.6 mole m-cresol.

EXAMPLE 31

Preparation of N-Ethylaniline-N-Methylaniline-Phenol-Acetaldehyde-Formaldehyde Condensate This example may be conducted in a similar manner as Example 26 above except that 0.32 moles of formaldehyde an be replaced by 0.32 mole acetaldehyde. The acetaldehyde is added prior to the formaldehyde.

EXAMPLE 32

Preparation of N-Ethylaniline-Phenol-Formaldehyde Condensate Using Methyl Carbitol Solvent This example may be conducted in a similar manner as Example 25 above except that 75 g phenol (0.8 moles) is replaced by 75 g methyl carbitol (monoethyl ether of diethylene glycol). Unreacted phenol and solvent is recovered by vacuum distillation, which is followed by steam sparging and drying.

EXAMPLE 33

Preparation of -N-Methylaniline-Phenol-Formaldehyde Condensate—Post Addition of Triethylamine This example may be conducted in a manner similar to Example 23 above except that 2.4 g triethylamine is added immediately after the second addition of N-methylaniline.

EXAMPLE 34

Preparation of N-Ethylaniline-Phenol Formaldehyde Condensate with Initial Addition of Triethylamine (Method 5)

A one liter flask was charged with 301.1 g (grams) of phenol (3.2 moles) 194 g N-ethylaniline, and 3.01 g triethylamine. pH's of the reaction mixture were 7.34 and 8.80 before and after addition of the amine, respectively. The reaction mixture was heated to 80° C. and then 191.4 g of 50.3% formalin (3.2 moles) was added over 1 hour at 80° C. A temperature of 80° C. was maintained for 2 hours and the pH was 8.01. Percent phenol taken 5 minutes* after addition of formaldehyde and post 2 hours at 80° C. was essentially constant, that is 12.4% plus or minus 0.1%. This indicated 72% reaction of the phenol. *The phenol taken after 5 minutes had an alloquot heated for 2 hours at 95° C. in the presence of 2% formic acid and the molecular weight Mw/Mn was found to be 959/432. The temperature was raised to 100° C. and maintained for 1 hour. At this time the % phenol was 164% (74% conversion) and the pH was 8.47. Atmospheric distillate (294.7 g), phenol vacuum distillate (64.5 G) and product (433.5g) were recovered as described in Example 23 above. Product was characterized by phenol 0.5%; 4.87% nitrogen; Mw/Mn, 893/409; viscosity, of 589 cps (150° C.) , and a Methanol Tolerance of 332%.

EXAMPLE 35

Preparation of N-Ethylaniline-Phenol Formaldehyde Condensate Using the Method of Method 6

A reactor is charged with 376.4 g phenol (4 moles) and 95.5 g 50% formalin (1.6 moles). This reaction mixture is heated to 60° C. whereupon 96.8 g N-ethylaniline (0.8 moles) is added at 60° C. over 40 minutes. The reaction mixture is then heated at 80° C. for 1 hour and then 1 hour at 100° C. to substantially completely react the phenol. The reaction mixture is cooled to 70° C. Then 96.8 g of N-ethylaniline (0.8 moles) is added followed by addition of 95.5 g of 50% formalin (1.6 moles) at 70° C. over 45 minutes. This reaction mixture is then heated at 80° C. for 2 hours and at 100° C. for 1 hour. Atmospheric distillate, phenol and product are removed as described in Example 23 above. In a similar manner 85.6 g of N-methylaniline (0.8 moles) may be substituted for the 96.8 g of N-ethylaniline (0.8 moles) in the first reaction stage (i.e. Reverse Method) to give a N-ethylaniline-N-methylaniline-phenol-formaldehyde condensate.

COMPARATIVE EXAMPLE 1
Attempted Reaction of Phenol and Formaldehyde Using Tertiary Aromatic Amine A 250 ml flask was charged with 75.3 g phenol (0.8 mole) and 24 g N,N-dimethyl-p-toluidine. The mixture was heated to 70° C. and 23.7 g 50.2% formalin (0.4 mole) added over 17 minutes. The percent free phenol at this time was 58.4%, which corresponds to 5% reaction. After heating one hour at 70° C. the percent free phenol was 54.6%, which corresponds to 11% reaction. Eighteen minutes later the temperature was reduced to 60° C. and 0.75 g triethylamine added. The temperature was raised to 70° C. and maintained for one hour. The percent free phenol was 38.4%, which corresponds to 37% reaction.

N,N-dimethyl-p-toluidine of Comparative Example 1 which can be considered a model for N-alkylation and para aminoalkylation reactions has a pH basicity of 7.24 which is significantly stronger than N-methylaniline (pK 4.85) or N-ethylaniline (pK 5.11). Despite the higher basicity it showed little catalytic activity for the reaction of formaldehyde and phenol at 70° C. In contrast, the considerably stronger triethylamine (pK 10.72) led to significant reaction after one hour at 70° C.

COMPARATIVE EXAMPLE 2
Attempted Reaction of N,N-Diethylaniline with Formaldehyde in Diglyme A 250 ml flask was charged with 75 g N,N-diethylaniline (0.5 mole) and 75 g diglyme (2-methoxyethyl ether). The mixture was heated to 70° C. and 15 g 50% formalin added over 10 minutes. No exotherm was observed. A temperature of 70–72° C. was maintained for one hour and then the temperature was raised to 80° C. After one hour at 80° C. the temperature was raised to 100° C. and then maintained at 100° C. for one hour. Very little reaction was observed after the one hour intervals at temperatures of 70° C., 80° C. and 100° C.

The Tertiary aromatic amine N,N-diethylaniline of the above Comparative Example 2 lacks the —NH site present in N-ethylaniline and therefore shows essentially no reactivity with formaldehyde, at least in the absence of phenol. In contrast, N-ethylaniline exhibits exotherm activity with formaldehyde over the entire temperature range 30°C. to 100° C. Attack at the para position of N,N-diethylaniline would be possible with methylol phenol or N-methylol aniline intermediates.

TABLE 1A

Preparation of N-Ethylaniline-Phenol-Formaldehyde (E-P-F) Condensates via the Standard Method

| Ex. | Moles P[e] | Moles E[f] | Moles F[g] | Add Temp., ° C. Acid (%)[a] | Reaction Conditions, hrs/° C.[b] |
|---|---|---|---|---|---|
| 1 | 0.8 | 0.4 | 0.8 | 30–33° C. AA (1.33) @ 36° C. | 1.5/70, 2/80, 0.5/100 |
| 2 | 3.2 | 1.6 | 3.2 | 50–52° C. AA (1.33) @ 50° C. | 1.5/70, 2/80, 0.5/100 |
| 3 | 3.2 | 1.6 | 3.2 | 70° C. AA (1.33) @ 70° C. | 1.5/70, 2/80, 0.5/100 |
| 4 | 3.2 | 1.6 | 2.9 | 70° C. FA (2.09) | 1.5/70, 2/80, 0.5/100 |
| 5 | 3.2 | 1.6 | 3.2 | 70° C. FA (2.09) | 2/70, 1/100 |
| 6 | 3.2 | 1.6 | 3.2 | 70° C. FA (0.33) | 2/70, 1/100 |
| 7 | 3.2 | 1.6 | 3.2 | 82° C. FA (2.09) | 2/80, 1/100 |
| 8 | 3.2 | 1.6 | 3.2 | 100° C. FA (2.09) | 2/100 |
| 9 | 3.2 | 1.6 | 3.2 | 60[c] ° C. OX (2.29) | 1/100 |
| 10 | 3.2 | 1.6 | 3.2 | 70[d] ° C. OX (2.29) | 0.5/100 |
| 11 | 4.0 | 1.6 | 3.2 | 70° C. None | 1.5/70, 2/80, 0.5/100 |
| 12 | 4.0 | 1.6 | 3.2 | 70° C. AA (1.06) | 1.5/70, 2/80, 0.5/100 |
| 13 | 4.0 | 1.6 | 3.2 | 70° C. AA (1.06) @ 80° C. | 1.5/70, 2/80, 0.5/100 |
| 14 | 4.8 | 1.6 | 3.2 | 70° C. OX (1.53) | 2/70, 1/100 |
| 15 | 4.8 | 1.6 | 3.2 | 70° C. OX (100) @ 100° C. | 1.5/70, 2/80, 0.5/100, distilled to 110° C., 1/100, 1/110 |

[a]AA = acetic acid, FA = 90% formic acid, OX = oxalic acid 2H$_2$O. Percent acid in parentheses by weight on phenol weight. When the acid was added prior to the addition of formaldehyde, the first set of temperature readings give the temperature of the reaction mixture containing the acid when the formaldehyde was added; however, when the acid was added after the addition of the formaldehyde, the temperature of the reaction mixture when the acid was added is prefixed with the @ notation and the first set of temperature readings are that of the reaction mixture when the formaldehyde was added.
[b]After addition of formaldehyde.
[c]½ of F added over 50 minutes vacuum dry to 75° C., remainder of F added over 50 minutes at 60° C., react 30 minutes and vacuum dry to 75° C.
[d]½ of F added over 40 minutes, vacuum dry to 75° C., react one hour at 70° C., add remainder of F over 40 minutes at 70° C., react 35 minutes at 70° C., vacuum dry to 80° C.
[e]P is phenol.
[f]E is N-ethylaniline.
[g]F is formaldehyde.

TABLE 1B

Properties of N-Ethylaniline-Phenol-Formaldehyde Condensates
The below table shows: the percent of free (unreacted) phenol in the condensate; the amount of nitrogen combined in the condensate, the weight molecular weight (Mw), the number molecular weight (Mn) and viscosity in centipoise at the indicated temperatures.

| Ex. | Phenol, % | N, % | Mw/Mn | Viscosity, cps (° C.) |
|---|---|---|---|---|
| 1 | 0.93 | 5.34 | 2572/634 | 6715 (150°) |
| 2 | 0.98 | 5.11 | 1821/553 | 2370 (154°) |
| 3 | 1.15 | 5.17 | 1478/510 | 1134 (154°) |
| 4 | 0.65 | 5.20 | 991/482 | 1007 (150°) |
| 5 | 1.26 | 5.44 | 893/474 | 1386 (150°) |
| 6 | 0.48 | 4.65 | 1022/468 | 1205 (150°) |
| 7 | 0.14 | 5.39 | 878/469 | 1136 (150°) |
| 8 | — | 5.61 | 1726/614 | 1829 (175°) |
| 9 | — | 5.48 | 774/462 | 1633 (175°) |
| 10 | — | 5.46 | 618/416 | 1030 (175°) |
| 11 | 0.12 | 4.91 | 791/393 | 380 (175°) |
| 12 | 0.11 | 5.40 | 1215/498 | 1200 (175°) |
| 13 | 1.5 (0.2)[a] | 4.97 | 904/423 | 510 (840)[a] (154°) |
| 14 | 1.3 | 5.02 | 861/443 | 727 (150°) |
| 15 | 0.06 | 4.78 | 597/350 | 215 (154°) |

[a]After 2 hours at 185–190° C. and 29" vacuum

From the results in Tables 1A and 1B it can be seen that:

1. Increasing the temperature (30°C. to 70° C.) when formaldehyde is added leads to a marked decrease in Mw and viscosity with essentially no change in percent nitrogen (Ex's 1–3).

2. Addition of formic acid initially (Ex. 5) versus adding acetic acid after addition of formaldehyde(Ex. 3) results in a significant decrease in Mw but little effect on viscosity.
3. Reduction of formic acid (Ex. 6 vs. Ex. 5) has only a marginal effect on Mw and viscosity.
4. Addition of formaldehyde at elevated temperature (100° C., Ex. 8) vs. 70° C. (Ex. 5) leads to a significant increase in Mw and viscosity.
5. Use of oxalic acid (Exs. 9, 10) versus formic acid (Exs. 3, 5–7) leads to a significant decrease in Mw but an increase in viscosity (considering differences in viscosity temperature).
6. Deletion of acetic acid (Ex. 11) vs. Ex. 12 leads to a significant decrease in Mw and viscosity.
7. Post formaldehyde addition of acetic acid (at 80° C., Ex. 13) vs. addition prior to formaldehyde (Ex. 12) leads to a significant decrease in Mw and viscosity.
8. Increasing the phenol/N-ethylaniline ratio (Ex. 12 vs. Ex. 3) doe not lead to a dramatic effect on properties.
9. Post formaldehyde addition of oxalic acid (Ex. 15 vs. Ex. 14) at 100° C. leads to a significant decrease in Mw and viscosity.
10. It can be seen that substitution of phenol by o-cresol (Ex. 7) leads to a dramatic decrease in Mw and viscosity with the expected small decrease in percent nitrogen.

TABLE 2A

Preparation of N-Methylaniline-Phenol-Formaldehyde (M-P-F) Condensates via The Standard Method

| Ex. | Moles P$^{(d)}$ | Moles M$^{(e)}$ | Moles F$^{(f)}$ | Add Temp., ° C. Acid (%)$^{(a)}$ | Reaction Conditions, hrs/° C.$^{(b)}$ |
|---|---|---|---|---|---|
| 17 | 2.4 | 1.6 | 2.88 | 70° C. FA (3.10) | 2/70, 1/100 |
| 18 | 3.2 | 1.6 | 3.2 | 70° C. FA (2.09) | 2/70, 1/100 |
| 19 | 4.0 | 1.6 | 3.2 | 70° C. FA (2.09) | 2/70, 1/100 |
| 20 | 5.0 | 1.0 | 3.6 | 70/100$^{(c)}$ ° C. FA (1.49) | 3.5/100 |

$^{(a)}$and $^{(b)}$have the same designation as in Table 1A
$^{(c)}$1.0 mole added at 70° C. and 2.6 moles added at 100° C.; whereas $^{(d)}$, $^{(e)}$, and $^{(f)}$are phenol, N-methylaniline, and formaldehyde respectively.

TABLE 2B

Properties of N-Methylaniline-Phenol-Formaldehyde Condensates

| Ex. | Phenol, % | N, % | Mw/Mn | Viscosity, cps (° C.) |
|---|---|---|---|---|
| 17 | — | 6.66 | 2431/709 | 6095 (175°) |
| 18 | 0.75 | 5.42 | 3234/811 | >8100 (180°) |
| 19 | 0.52 | 5.12 | 1638/597 | 7330 (175°) |
| 20 | 0.81 | 3.27 | 2606/751 | 2291 (175°) |

From the results in Tables 2A and 2B, it can be seen that:

1. Substitution of N-ethylaniline (Ex. 5) by N-methylaniline (Ex. 18) leads to a very large increase in Mw and particularly in viscosity.
2. All three mole ratios (Exs. 17–19) gave relatively high Mw and viscosity but with a wide range in percent nitrogen.

TABLE 3A

Preparation of N-Alkylaniline-Phenol-Formaldehyde Condensates via The Reverse Method$^{(a)}$
In the following Table 3A, "P" stands for phenol, "E" stands for N-ethylaniline, "M" stands for N-methylaniline; and "F" stands for formaldehyde. The percent of added acid is based on the weight of phenol charged.

| Ex. | Moles P | Moles E | Moles M | Moles F | Acid (%)$^{(a)}$ | Reaction Conditions, hrs/° C.$^{(b)}$ |
|---|---|---|---|---|---|---|
| 21 | 2.4 | — | 1.6 | 2.88 | FA (3.10) | 0.5/50, add acid, 1/100 |
| 22 | 2.6 | — | 1.6 | 2.88 | FA (2.86) | 0.5/60, add acid, 1/100 |
| 23 | 2.6 | — | 1.6 | 2.88 | NONE | 0.5/60, 1/100 |
| 24 | 4.0 | — | 1.6 | 3.2 | FA (1.86) | 1/50, add acid, 1/100 |
| 25 | 4.0 | 1.6 | — | 3.2 | FA (1.86) | 1/50, add acid, 1/100 |

$^{(a)}$N-alkylaniline added to phenol-formaldehyde mixture at 50° C. (Exs. 21, 24, 25) or at 60° C. (Exs. 22, 23)
$^{(b)}$90% formic acid (FA) added after addition of N-alkylaniline.

TABLE 3B

Properties of N-Methylaniline-Phenol-Formaldehyde Condensates

| Ex. | Phenol, % | N, % | Mw/Mn | Viscosity, cps (° C.) |
|---|---|---|---|---|
| 21 | — | 5.97 | 1414/456 | 944 (175°) |
| 22 | — | 5.81 | 1430/440 | 616 (175°) |
| 23 | 0.19 | 5.81 | 1157/433 | 404 (175°) |
| 24 | — | 5.26 | 908/395 | 1832 (175°) |
| 25 | 0.65 | 4.96 | 973/429 | 858 (150°) |

It can be seen from the results in Table 3A and 3B that:

1. The Reverse Method with N-methylaniline (Ex. 21) compared to the Standard Method (Ex. 17) affords greatly reduced Mw and viscosity.
2. Omission of formic acid (Ex. 23 vs. Ex. 22) leads to a significant decrease in Mw and viscosity.
3. Substitution of N-methylaniline (Ex. 24) by N-ethylaniline (Ex. 25) has essentially no effect on Mw but significantly reduces viscosity.
4. Example 19, as shown in Table 2B was performed under substantially the same conditions as Example 24 of Table 3B. However, it can be seen that Example 24 which used the Reverse Method produced condensate having lower viscosity.

It can be seen from Tables 1B, 2B, and 3B that the Reverse Method provides lower molecular weights and lower viscosities as compared to the Standard Method.

TABLE 4 pH of Reaction Mixture

| Ex. | Time Sampled | pH |
|---|---|---|
| 1 | After ½ of formaldehyde added | 7.28 |
|  | 1⅓ hours after acetic acid added | 6.03 |
| 4, 5 | Immediately before and after addition of formic acid | 7.09/5.1 |
| 14 | After ½ of formaldehyde added; | 5.6 |
|  | ⅔ hours after formaldehyde added | 5.6 |

TABLE 4-continued pH of Reaction Mixture

| Ex. | Time Sampled | pH |
|---|---|---|
| 34 | Before triethylamine is added | 7.3 |
|  | Before formaldehyde is added | 8.8 |
|  | After formaldehyde is added | 8.0 |

TABLE 5

Application Results
In the below table, HPC, i.e., hot plate cure, as well as the other headings in the table are determined in accordance with the methods set forth herein.

| Ex. | HPC, sec. (c) (d) | Adhesion (c) | Impact Resistance (c) | Methanol Tolerance, % |
|---|---|---|---|---|
| Durite SD-1732 (control) | 192 | Pass (P) Fail (F)[a] | P, F[a] | Infinite |
| Durite SD-1708 (control) |  |  |  | Infinite |
| 7 |  |  |  | 82 |
| 8 | 38 | F | F | <5 |
| 17 |  |  |  | <5 |
| 18 | — | — | P | <5 |
| 19 | — | P | P | 23 |
| 22 | 45 | F, F[b] | F, F[b] | 23 |
| 23 | 41 (36)[b] | F, P[b] | F, P[b] | 46 |
| 24* | 46 | P | P | 210 |
| 25 | 59 | P | P | 667 |
| 26 | 59 | P | P | 73 |
| 34 |  | F, F [a] [b] | F, F[b] | 332 |

*Essentially similar results can be obtained by substituting 0.5 g of 5% 2-methylimidazole by 2 grams of 59% solution of the condensate of Example 24 to cure the D.E.R. 383 epoxy resin. Although this would not be an effective curing agent it would be an effective accelerator.
[a] Approximately 50% tests failed
[b] 0.8 Hydroxyl equivalent used per one epoxy equivalent.
[c] Conducted in Formulation of Condensate with Epoxy Resin.
[d] sec in the above table refers to seconds.

It can be seen from Table 5 that:
1. The condensates of this invention cure much faster, up to 5x, than phenol novolac Durite SD-1732. In the absence of 2-methylimidazole accelerator condensates of this invention cure in less than ½ the time of SD-1732 with accelerator.
2. A wide range in Methanol Tolerance is observed with particularly high values exhibited by N-ethylaniline condensates (Exs. 24, 25) prepared by the Reverse Method.
3. A number of condensates (Exs. 19, 24–26) exhibit superior adhesion and impact resistance than Durite SD-1732.
4. The level of condensate curative (Ex. 23) affects adhesion and impact resistance. The lower level (0.8 OH equivalent per epoxy) showing the superior performance as well as faster cure.
5. The Reverse Method gives higher Methanol Tolerance.
6. The very great difference in Methanol Tolerance of the condensates of the instant invention is surprising and unexpected in light of the infinite Methanol Tolerance of the phenol/formaldehyde controls which span the molecular weight Mw of about 950 for Durite SD-1752 and 2500 for Durite SD-1708.

Determination of Hydroxyl Equivalent

This procedure involves a known weight of sample which is refluxed with excess acetic anhydride in pyridine. Subsequently, unreacted anhydride is destroyed by reaction with water. The resulting mixture is titrated with 0.1N NaOH. The result is compared to a blank (i.e., no resin).

When the above procedure was conducted with several resins of the instant invention very misleading results (OH numbers of ca. 120–130), i.e., irreconcilable with material balance of reactants, were obtained. Erroneous results were likewise obtained with a model material (Ancamine 1110, N,N-dimethylaminomethyl phenol, a product of Air Products and Chemicals, Inc.) wherein a value about ⅓ of theory was obtained.

Hydroxyl equivalent was calculated from product yield (grams) by determining phenol content after subtracting the contribution of N-substituted arylamine and methylene (fragment resulting from formaldehyde). In this manner hydroxyl equivalents of about 195 to about 220 were obtained.

Determination of Melt Viscosities

Viscosities, at 175° C., were determined with a cone and plate viscometer from Research Equipment (London) Ltd. Number 40 and 100 spindles were used depending on the viscosity reading. A factor multiplier of 300 was used for the Number 40 spindle and a factor multiplier of 800 was used for the of 100 spindle values shown from digital readout. For example, a digital reading of 20 obtained with a #40 cone spindle would be multiplied by 300 to give a viscosity value of 600 cps. Viscosities, at 150° C., were determined the same way as for 175° C. except that the No. 40 spindle has a factor of 330 and the No. 100 spindle has a factor of 890.

Determination of pH of Reaction Mixtures

One gram of reaction mixture was diluted with 50 mls methanol. pH was determined by using a single probe electrode pH meter, previously calibrated at pHs of 4 and 7. Results are shown in Table 4.

Determination of Methanol Tolerance (Methanol Tolerance Method)

A solution prepared by dissolving equal parts by weight of condensate of this invention and methanol is used in this determination. To 3.0 g of such 50% solution was gradually added methanol until a turbidity persisted at 25° C.±1° C. Methanol Tolerance (%) was calculated from g methanol to turbidity×100/3.0 g Results for Methanol Tolerance are shown in Table 5.

Determination of Solubility of N-substituted arylamine-Phenol-Formaldehyde Condensates Condensate with an equal weight of solvent was placed in a jar, closed, placed in a 60° C. oven and intermittently shaken until dissolved. Upon cooling to room temperature a clear solution resulted. Solvents so tested on Examples 21, 23, 25, 26, and 27 were n-butanol, methyl isobutyl ketone, and bis(2-methoxyethyl) ether (diglyme).

Formulation of Condensates of this Invention with Epoxy Resin

The halogen free epoxy resin used was D.E.R. 383 a product of Dow Chemical (Midland, Mich.) with weight per epoxy equivalent of 189. N-substituted arylamine-phenol-formaldehyde condensates were generally employed as a 59% solution in solvent (65 g resin, 35 g methyl ethyl ketone, 10 g Dowanol PM). The formulation, unless indicated otherwise, was as follows:

| | |
|---|---|
| D.E.R. 383 | 12.5 g |
| 59% resin solution | 21–24 g* |
| 5% 2-methylimidazole in Dowanol PM | 0.5 g |

An additional gram of Dowanol PM was added to very viscous formulations to facilitate dissolution of condensate and to facilitate the draw-down of the coatings (this applies to Examples 17–19).
*Weight to provide one phenolic OH equivalent per epoxy equivalent. For phenol-formaldehyde novolac Durite SD-1732 (Borden Chemical, Louisville KY) with OH equivalent of 105 9.9 grams of 70% solution were used. The Mw of this resin is ca. 950.
Resin and epoxy were thoroughly mixed prior to addition of the imidazole. Formulations when not used immediately (as for coating or hot plate cures) were refrigerated.
Use of triphenylphosphine (ca. 1% on epoxy resin) as accelerator and phosphorus acid (ca. 3% on epoxy resin) can further enhance fire retardancy of the cured epoxy composition.

Coating and Curing of Epoxy Formulation

4–5 mls of epoxy formulation were placed in front of a draw down bar (opening of 6⅛ inches) and a coating made by drawing down on solvent cleaned (ethanol then MEK) copper sheet. Coatings were air dried 1–2 hours at ambient temperatures followed by one hour each at 60° C., 100° C. and 160° C. Coating thickness was generally 0.01"±0.015". All formulations with the inventive condensate gave coatings which were tack-free at room temperature after one hour at 60° C. Formulations with Durite SD-1732 were tacky to the touch. Furthermore, the SD-1732 coatings strongly had a mottled ("fisheye") appearance which was not observed with coatings of the inventive condensates.

Adhesion Testing of Epoxy Formulation Coatings

⅝" strips were cut from the cured coatings on copper sheet. The strips were then bent 180° around a rigid rod of ¾" diameter. Cracking or peeling of the coating constituted a failure (F). No change in coating constituted a pass (P). Tests were conducted in at least duplicate. Results are shown in Table 5.

Impact Resistance Testing of Epoxy Coatings on Copper

The test was conducted as follows: Panels of cured epoxy formulations on copper sheet were placed on a wood block. Then a 406 g weight (6¼" long) terminated with the top end of a 200 g calibration weight was dropped through a 6½' tube (1³⁄₁₆" diameter) placed perpendicular to the panel onto the back side of the coated panel. A cracking or rupture of the coating at point of impact constituted a failure (F). No cracking constituted pass (P). The test was conducted in duplicate. Results are shown in Table 5.

Preparation of Laminates from Epoxy Formulation

Formulations used to coat copper sheet can be used to coat glass cloth commonly used by laminators. The coated cloth is allowed to air dry at room temperature for one hour, dried at ~100° C. for ½ hour. Tack-free strips are stacked into a several ply sandwich. This configuration is then placed under pressure between two metal plates preheated at ~170° C. for 1½ hours. The resulting laminate can be trimmed and tested for mechanical properties as well as for fire-retardancy.

Determination of Hot Plate Cure (HPC)

One gram of epoxy formulation is placed at the end of a stainless steel spatula 1" in width. The liquid is then placed at the center of a hot plate at 170° C.±1° C. After several seconds allowing for evaporation of volatile solvents(s) the mix is stroked with ½ the width of the spatula 1" to the right and 1" to the left repeatedly on the hot plate. The mix becomes transformed to a stringy mass. The time when the strings break, i.e., no longer connect from the spatula to the hot plate, is considered the cure time and is recorded in seconds. The test was conducted in duplicate. Results are shown in Table 5.

Determination of Molecular Weights

The weight average molecular weight (Mw) and number average molecular weight(Mn) herein are measured using size exclusion gel permeation chromatography (SEC) and phenolic compounds and polystyrene standards. The sample molecular weight to be measured is prepared as follows: the sample is dissolved in tetrahydrofuran and the solution is run through a gel permeation chromatograph. Any free phenolic in the sample is excluded from calculation of molecular weight. SEC as a measure of molecular weight is highly dependant on the hydrodynamic volume of the material in solvent. Highly branched or polycyclic materials tend to give lower values than molecular weights determined by other means such as vapor phase osmometry (VPO).

What is claimed is:

1. Is drawn to a condensation product of:
    1) an N-substituted arylamine selected from the group consisting of:
        a) a compound of formula I;

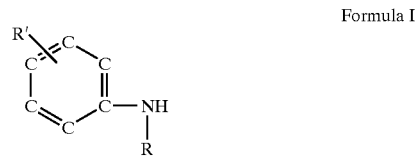

Formula I b) a compound of formula II;

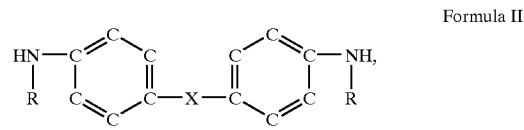

Formula II c) mixtures thereof, wherein one or more of the formula I compounds makes up at least 80 wt % of the N-substituted arylamine;
        wherein R is a lower alkyl containing 1 to 4 carbon atoms, hydroxyethyl, or hydroxypropyl; R' is a member selected from the group consisting of hydrogen, methyl or ethyl in the ortho or meta position in relation to the nitrogen; and X is a member selected from the group consisting of a covalent bond, oxygen, sulfur, carbonyl, and $SO_2$;
    2) a phenol selected from the group consisting of:
        a) phenol,
        b) alkyl phenol having from 1 to 4 carbon atoms in the alkyl group,
        c) a meta- or ortho- alkoxyphenol having from 1 to 4 carbon atoms in the alkoxy group,
        d) and mixtures thereof; and
    3) formaldehyde;
wherein the condensation product is:
    A) substantially free of water;
    B) has a nitrogen content of from about 3.5% to 6.5% by weight,
    C) not more than 2% by weight of free phenol, and
    D) a hydroxyl equivalent of about 195 to 220;

The closest prior art is Stockinger et al. (U.S. Pat. No. 4,500,691); Stockinger et al. disclose a condensation product of:
    1) an N-substituted arylamine selected from the group consisting of:

a) a compound of formula III:

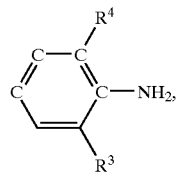
(III)

and b) a compound of formula IV:

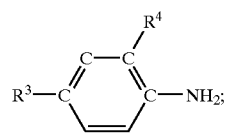
(IV)

wherein $R^4$ and $R^5$ can be a linear or branched alkyl group with 1 to 6 carbon atoms or an alkoxy group with 1 to 4 carbon atoms (other disclosed embodiments of $R^4$ and $R^5$ are not with the scope of the instant invention);

2) a phenol selected from the group consisting of:
a) a substituted phenol of formula I:

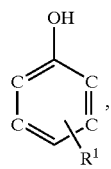
(I)

and b) a polynuclear substituted phenol of formula V:

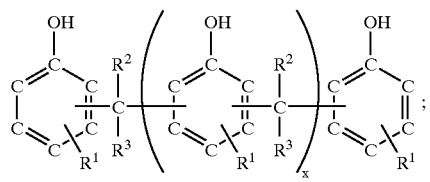
(V)

wherein $R^1$ can be a linear or branched alkyl group with 1 to 6 carbon atoms or an alkoxy group having 1 to 6 carbon atoms (other disclosed embodiments of $R^1$ are not within the scope of the instant invention), and x is 0 to 18; and c) an aldehyde of formula II:

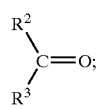
(II)

wherein $R^2$ and $R^3$ can be hydrogen, yielding a formaldehyde;

wherein the condensation product has a structure of:

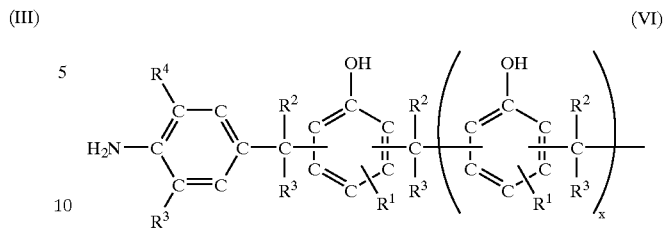
(VI)

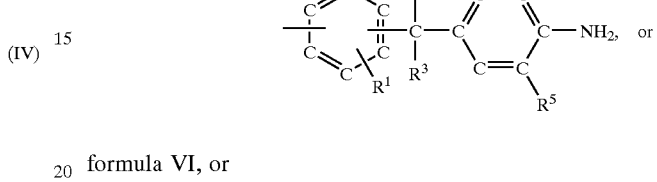

formula VI, or

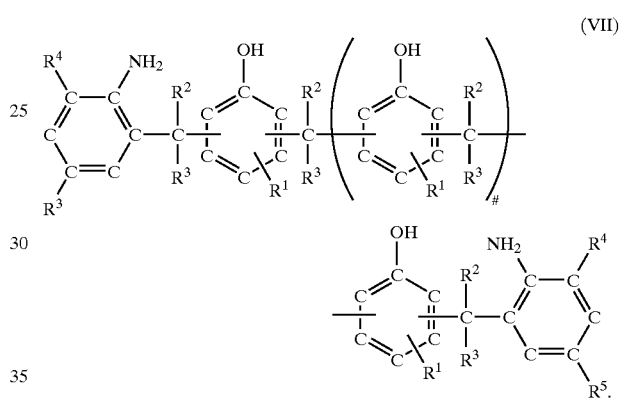
(VII)

formula VII

Stockinger et al. do not go into detail regarding: A) the presence of water, B) the nitrogen content, C) presence of free phenol, and D) the hydroxyl equivalent. Of these parameters, the nitrogen content and hydroxyl equivalent can be calculated form formulae VI and VII. The following is breakdown of nitrogen content and hydroxyl equivalent. Methyl groups were chosen for $R^1$, $R^4$, and $R^5$ because they would yield a lower overall weight, maximizing the nitrogen content. $R^2$ and $R^3$ were designated as hydrogen atoms, corresponding to the selection of formaldehyde.

| X value | Total wt. | Nitrogen wt. | Nitrogen wt. % | OH equivalent |
|---|---|---|---|---|
| 0 | 494 | 28 | 5.7% | 34 |
| 1 | 614 | 28 | 4.6% | 51 |
| 2 | 734 | 28 | 3.8% | 68 |
| 3 | 854 | 28 | 3.3% | 85 |
| 4 | 974 | 28 | 2.9% | 102 |
| 5 | 1094 | 28 | 2.6% | 119 |
| 6 | 1214 | 28 | 2.3% | 136 |
| 7 | 1334 | 28 | 2.1% | 153 |
| 8 | 1454 | 28 | 1.9% | 170 |
| 9 | 1574 | 28 | 1.8% | 187 |
| 10 | 1694 | 28 | 1.7% | 204 |

2. The product of claim 1 which contains from about 4.5% to about 6% of nitrogen and has a melt viscosity of not more than about 2,000 cps at 175° C. and one or more of the Formula I compounds makes up at least 90% by weight of the N-substituted arylamine.

3. The product of claim 1 wherein the condensate contains from about 35% to 63% by weight of phenol residue and has a melt viscosity of not more than about 1,000 cps at 175° C.

4. The product of claim 1 wherein the phenol is phenol itself or a mixture of phenol itself and not more than 10% by weight of an ortho- or meta-alkylphenol having from 1 to 4 carbon atoms in the alkyl group.

5. The product of claim 1 wherein the N-substituted arylamine is a member selected from the group consisting of N-methylaniline, N-ethylaniline and mixtures thereof.

6. The product of claim 1 wherein up to 10 mole percent of the formaldehyde is replaced with another aldehyde having from 2 to 7 carbon atoms.

7. The product of claim 1 wherein such product has a Methanol Tolerance of at least 40% at 25° C. by the Methanol Tolerance Method.

8. An epoxy resin composition comprising:

(A) an epoxy resin; and (B) the condensation product of claim 1 wherein for each 100 parts by weight of epoxy resin the composition contains: (a) about 0–30 parts of phenolic-formaldehyde novolac; and (b) about 5 to 100 parts of said condensate; (c) provided that when the quantity, by weight, of of said condensate is 5–25 parts, the quantity of said novolac is about 20–30 parts by weight.

9. The composition of claim 8 wherein the phenol is phenol itself and the N-substituted arylamine is a member selected from the group consisting of N-methyl or N-ethyl aniline.

10. A prepreg comprising a porous substrate impregnated with the epoxy resin composition of claim 8.

11. A laminate comprising a plurality of prepregs according to claim 10 laminated together wherein said epoxy resin composition is cured.

12. A prepreg of claim 10 wherein the condensation product dissolves completely when a mixture of equal parts by weight of said condensation product and n-butanol is heated at 60° C. and remains dissolved upon cooling to room temperature.

13. Is drawn to a condensation product containing:
1) the residue of one mole of a member selected from the group consisting of:
   a) N-methylaniline,
   b) N-ethylaniline, and
   c) mixtures thereof;
2) 40% to 60% by weight of a member selected from the group consisting of:
   a) residue of phenol, and
   b) residue of a mixture of phenol and an alkyl phenol having from 1 to 4 carbon atoms in the alkyl group,
3) 1.5 to 3 moles of formaldehyde residue;.
wherein the condensation product has a nitrogen content of 3.5% to 6.5% by weight; a methanol tolerance of at least 40% at 25° C. as measure by the Methanol Tolerance Method (detailed on page 36 of the Specification); is substantially free of water; and contains not more than about 2% by weight of free phenol.

14. A product of claim 13 having a melt viscosity of not more than 1,000 cps at 175° C., which contains 4.5% to 6% by weight of nitrogen, and the phenol is phenol itself and the said aniline is N-ethylaniline.

* * * * *